US011456382B2

United States Patent
Economikos et al.

(10) Patent No.: US 11,456,382 B2
(45) Date of Patent: Sep. 27, 2022

(54) TRANSISTOR COMPRISING AN AIR GAP POSITIONED ADJACENT A GATE ELECTRODE

(71) Applicant: GLOBALFOUNDRIES U.S. Inc., Santa Clara, CA (US)

(72) Inventors: Laertis Economikos, Wappingers Falls, NY (US); Shesh Mani Pandey, Saratoga Springs, NY (US); Hui Zang, Guilderland, NY (US); Haiting Wang, Clifton Park, NY (US); Jinping Liu, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 21 days.

(21) Appl. No.: 16/664,056

(22) Filed: Oct. 25, 2019

(65) Prior Publication Data
US 2020/0066899 A1    Feb. 27, 2020

Related U.S. Application Data

(62) Division of application No. 16/016,828, filed on Jun. 25, 2018, now Pat. No. 10,535,771.

(51) Int. Cl.
| | | |
|---|---|---|
| H01L 29/49 | (2006.01) | |
| H01L 29/423 | (2006.01) | |
| H01L 29/78 | (2006.01) | |
| H01L 21/02 | (2006.01) | |
| H01L 29/66 | (2006.01) | |

(52) U.S. Cl.
CPC ...... *H01L 29/785* (2013.01); *H01L 21/02362* (2013.01); *H01L 29/4232* (2013.01); *H01L 29/4991* (2013.01); *H01L 29/6681* (2013.01); *H01L 29/66545* (2013.01)

(58) Field of Classification Search
CPC .. H01L 29/78; H01L 29/4991; H01L 29/4232
See application file for complete search history.

(56) References Cited

U.S. PATENT DOCUMENTS

| | | |
|---|---|---|
| 5,736,446 A | 4/1998 | Wu |
| 6,001,695 A | 12/1999 | Wu |
| 6,104,077 A | 8/2000 | Gardner et al. |
| 6,127,712 A | 10/2000 | Wu |
| 6,867,084 B1 | 3/2005 | Chui et al. |

(Continued)

*Primary Examiner* — Allen L Parker
*Assistant Examiner* — Gustavo G Ramallo
(74) *Attorney, Agent, or Firm* — Francois Pagette; Hoffman Warnick LLC

(57) ABSTRACT

A transistor device disclosed herein includes, among other things, a gate electrode positioned above a semiconductor material region, a sidewall spacer positioned adjacent the gate electrode, a gate insulation layer having a first portion positioned between the gate electrode and the semiconductor material region and a second portion positioned between a lower portion of the sidewall spacer and the gate electrode along a portion of a sidewall of the gate electrode, an air gap cavity located between the sidewall spacer and the gate electrode and above the second portion of the gate insulation layer, and a gate cap layer positioned above the gate electrode, wherein the gate cap layer seals an upper end of the air gap cavity so as to define an air gap positioned adjacent the gate electrode.

20 Claims, 7 Drawing Sheets

(56) References Cited

U.S. PATENT DOCUMENTS

| | | |
|---|---|---|
| 7,741,663 B2 | 6/2010 | Hause et al. |
| 8,390,079 B2 | 3/2013 | Horak et al. |
| 8,637,930 B2 | 1/2014 | Ando et al. |
| 9,515,156 B2 | 12/2016 | Besser et al. |
| 2003/0235943 A1 | 12/2003 | Trivedi |
| 2014/0138751 A1* | 5/2014 | Cai .................. H01L 29/42376 257/288 |
| 2018/0138280 A1* | 5/2018 | Li ..................... H01L 29/66545 |
| 2018/0158718 A1* | 6/2018 | Lee .................. H01L 27/10894 |
| 2018/0350938 A1* | 12/2018 | Lee .................. H01L 21/28026 |

\* cited by examiner

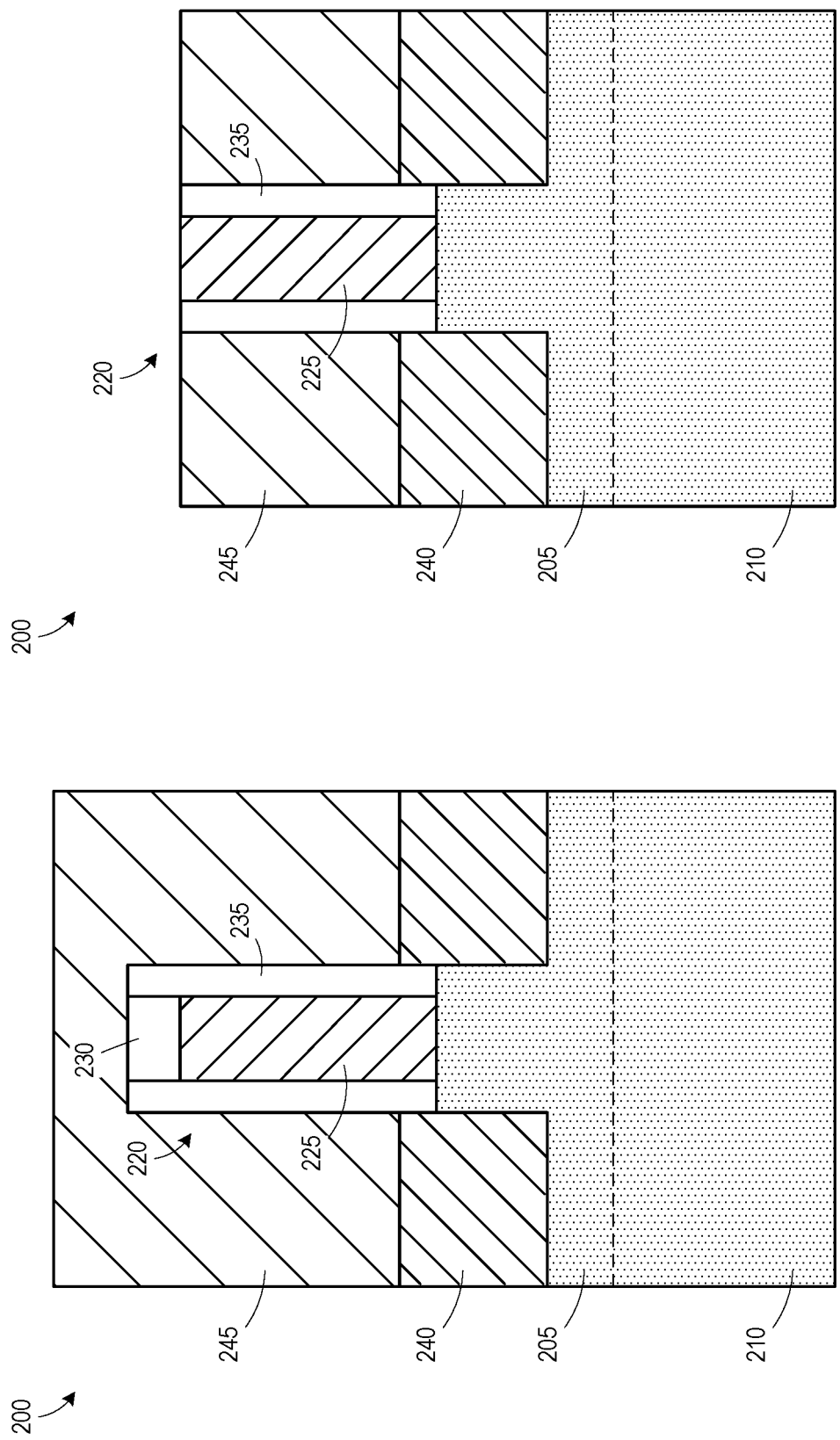

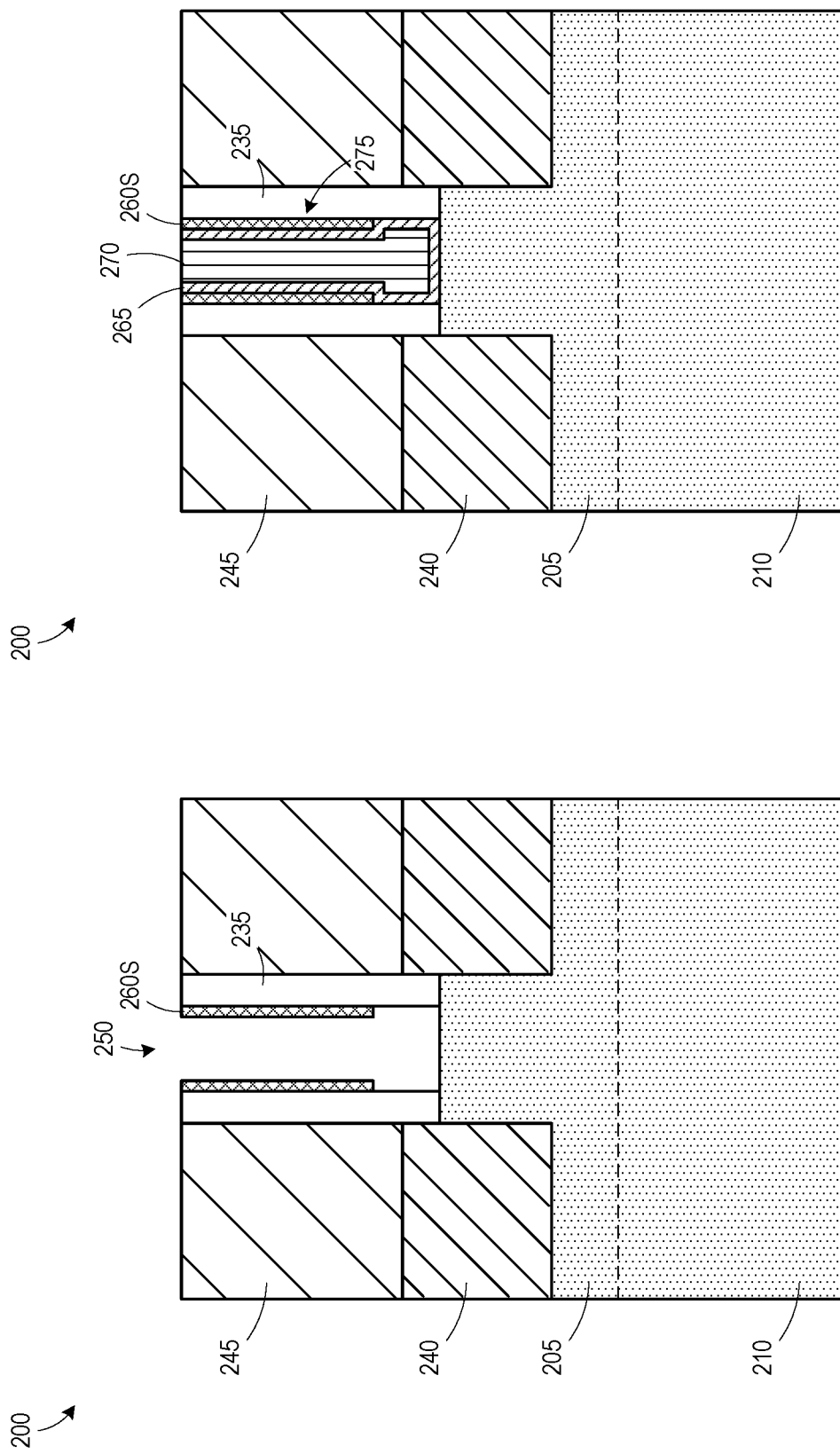

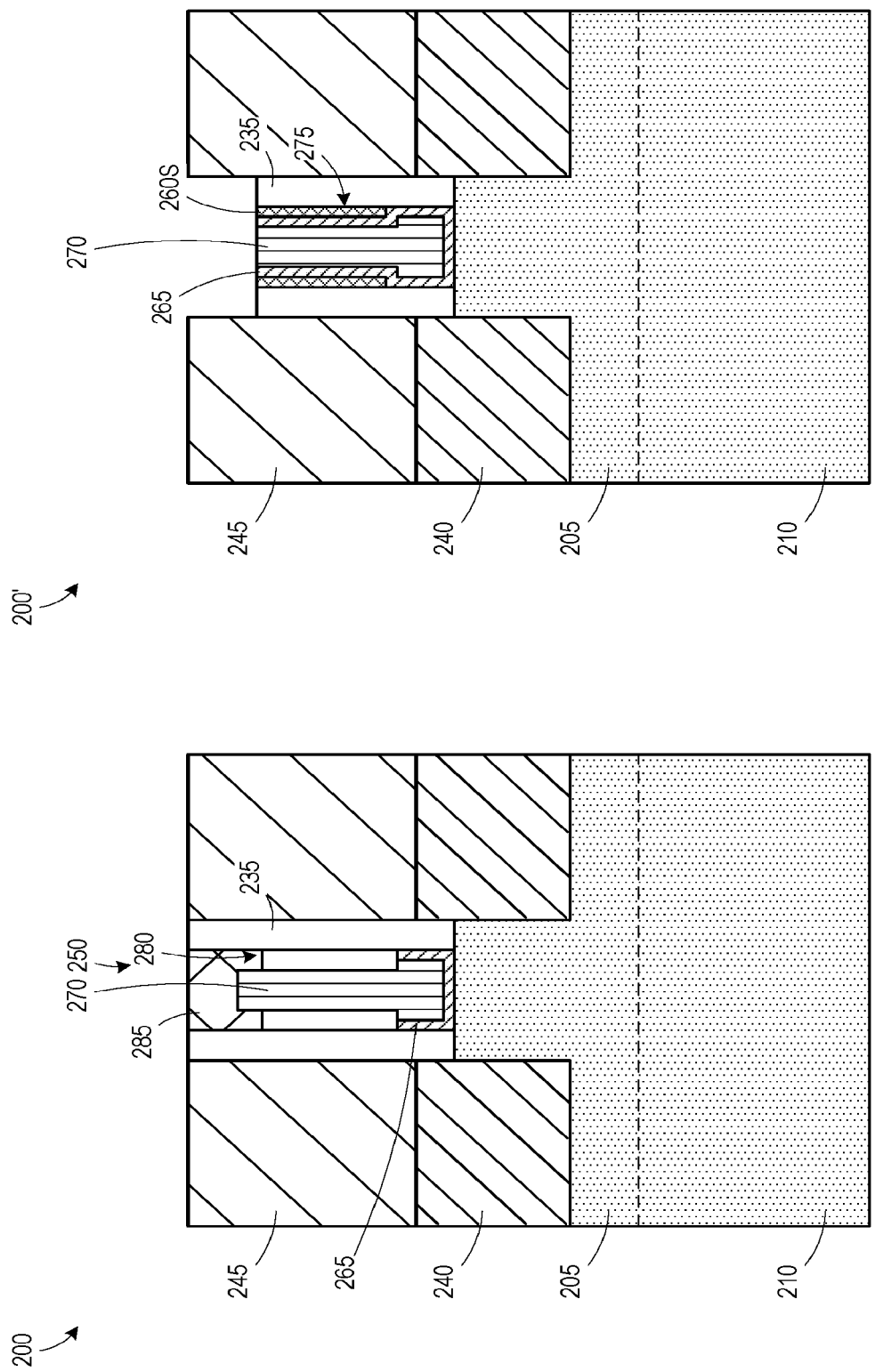

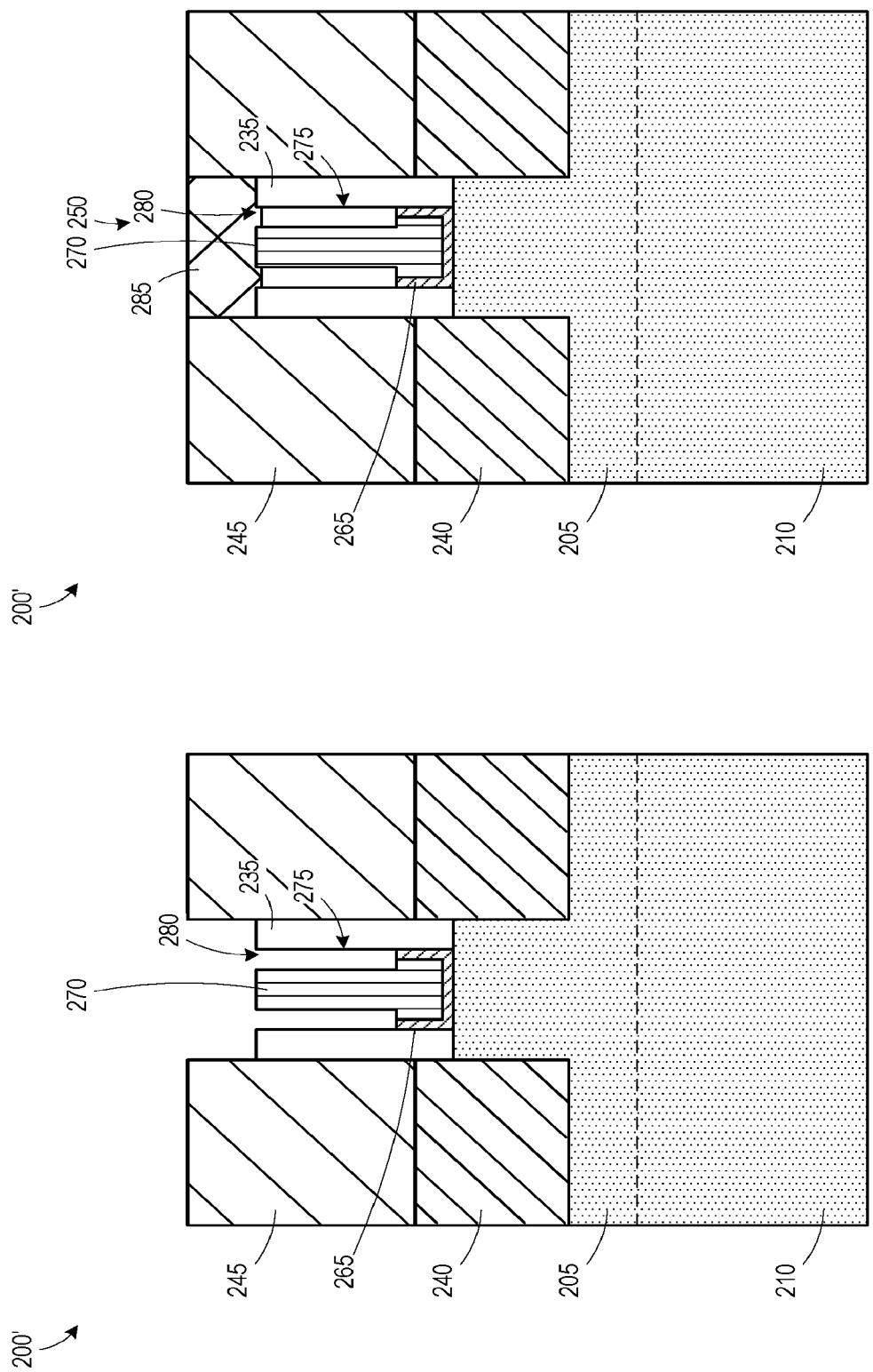

TRANSISTOR COMPRISING AN AIR GAP POSITIONED ADJACENT A GATE ELECTRODE

BACKGROUND

1. Field of the Invention

The present disclosure generally relates to the fabrication of semiconductor devices, and, more particularly, to a transistor that comprises an air gap positioned adjacent a gate electrode of the transistor.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1 is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

In an integrated circuit device, there are different performance requirements for different functional blocks or regions of the device. One technique for improving performance in a transistor device involves reducing the capacitance of the gate structure. Low dielectric constant materials have been employed for gate spacers to reduce the capacitance. To further reduce capacitance, air gaps have been employed in conjunction with the gate spacers. However, such techniques often require multiple process operations, which increases process complexity and can reduce yield.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a transistor that comprises an air gap positioned adjacent a gate electrode of the transistor. One illustrative device includes, among other things, a gate electrode positioned above a semiconductor material region, a sidewall spacer positioned adjacent the gate electrode, a gate insulation layer having a first portion positioned between the gate electrode and the semiconductor material region and a second portion positioned between a lower portion of the sidewall spacer and the gate electrode along a portion of a sidewall of the gate electrode, an air gap cavity located between the sidewall spacer and the gate electrode and above the second portion of the gate insulation layer, and a gate cap layer positioned above the gate electrode, wherein the gate cap layer seals an upper end of the air gap cavity so as to define an air gap positioned adjacent the gate electrode.

Another illustrative device includes, among other things, a gate electrode positioned above a semiconductor material region, a sidewall spacer positioned adjacent the gate electrode, a gate insulation layer having a first substantially horizontally oriented portion positioned between the gate electrode and the semiconductor material region and a second substantially vertically oriented portion positioned between a lower portion of the sidewall spacer and the gate electrode along a portion of a sidewall of the gate electrode, an air gap cavity located between the sidewall spacer and the gate electrode, wherein a lower end of the air gap cavity is bounded by an upper surface of the second substantially vertically oriented portion of the gate insulation layer, and a gate cap layer positioned above the gate electrode, wherein the gate cap layer seals an upper end of the air gap cavity so as to define an air gap positioned adjacent the gate electrode.

Yet another illustrative device includes, among other things, a gate electrode positioned above a semiconductor material region, a sidewall spacer positioned adjacent the gate electrode, the sidewall spacer comprising an inner surface and a vertical height, a gate insulation layer having a first substantially horizontally oriented portion positioned between the gate electrode and the semiconductor material region and a second substantially vertically oriented portion positioned along a portion of the vertical height of the sidewall spacer, wherein the second substantially vertically oriented portion of the gate insulation layer is positioned on and in contact with the inner surface of a lower portion of the sidewall spacer and on and in contact with a portion of a sidewall of the gate electrode, an air gap cavity located between the sidewall spacer and the gate electrode, wherein a lower end of the air gap cavity is bounded by an upper surface of the second substantially vertically oriented portion of the gate insulation layer, and a gate cap layer positioned above the gate electrode, wherein the gate cap layer seals an upper end of the air gap cavity so as to define an air gap positioned adjacent the gate electrode.

BRIEF DESCRIPTION OF THE DRAWINGS

The disclosure may be understood by reference to the following description taken in conjunction with the accompanying drawings, in which like reference numerals identify like elements, and in which:

FIGS. 2A-2I and 3A-3C depict various methods disclosed herein of forming transistor devices with an air gap in a replacement gate structure.

Figure 1:
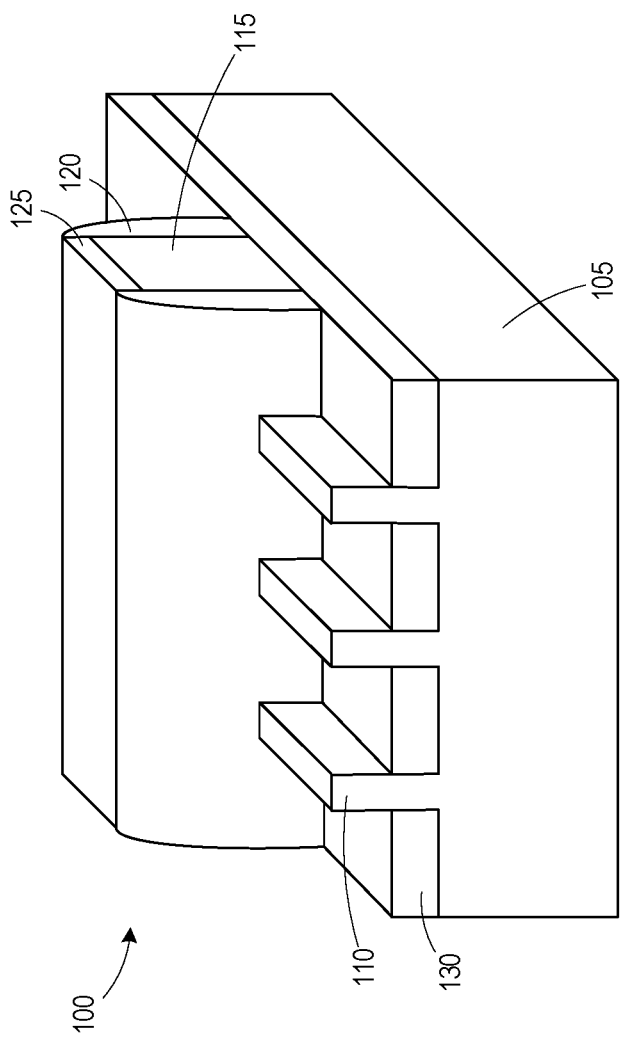
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming transistor devices with an air gap in the replacement gate structure. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2I and 3A-3C illustrate various illustrative methods disclosed herein for forming an integrated circuit product 200 with a replacement gate air gap. In the illustrated embodiment, the product includes finFET transistor devices, but the techniques described herein are not so limited, and they may be applied to other types of devices, such as planar devices. FIGS. 2A-2I and 3A-3C show a cross-sectional view of the product 200 taken through the long axis of one of a fin 205 formed in a substrate 210. The cross-sectional view is taken in a direction corresponding to the gate length direction of the product 200.

In the illustrated embodiment, a replacement gate technique is used to form devices in the product 200. A placeholder gate structure 220 was formed above the fin 205. The placeholder gate structure 220 includes a sacrificial placeholder material 225, such as amorphous polysilicon, and a gate insulation layer (not separately shown), such as silicon dioxide. Also depicted are an illustrative gate cap layer 230 and a sidewall spacer 235, both of which may be made of a dielectric material such as silicon nitride. Source/drain regions 240 were formed adjacent the placeholder gate structure 220 by recessing the fin 205 and performing an epitaxial growth process. A dielectric layer 245 (e.g., silicon dioxide, a low-k dielectric material having a dielectric constant of approximately 3.0 or lower, or an ultra-low-k (ULK) material having a dielectric constant of approximately 2.5 or lower) was formed above the placeholder gate structure 220 and the source/drain regions 240.

The transistor devices formed in the product 200 depicted herein may be either NMOS or PMOS transistors, or a combination of both. Additionally, various doped regions, e.g., halo implant regions, well regions and the like, may be formed, but are not depicted in the attached drawings. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fin 205 may be formed in a process layer formed above the base layer of the substrate 210.

FIG. 2B illustrates the product 200 after the dielectric layer 245 was planarized to remove the gate cap layer 230, reduce the height of the sidewall spacer 235, and expose a top surface of the sacrificial placeholder material 225.

Figure 2D:
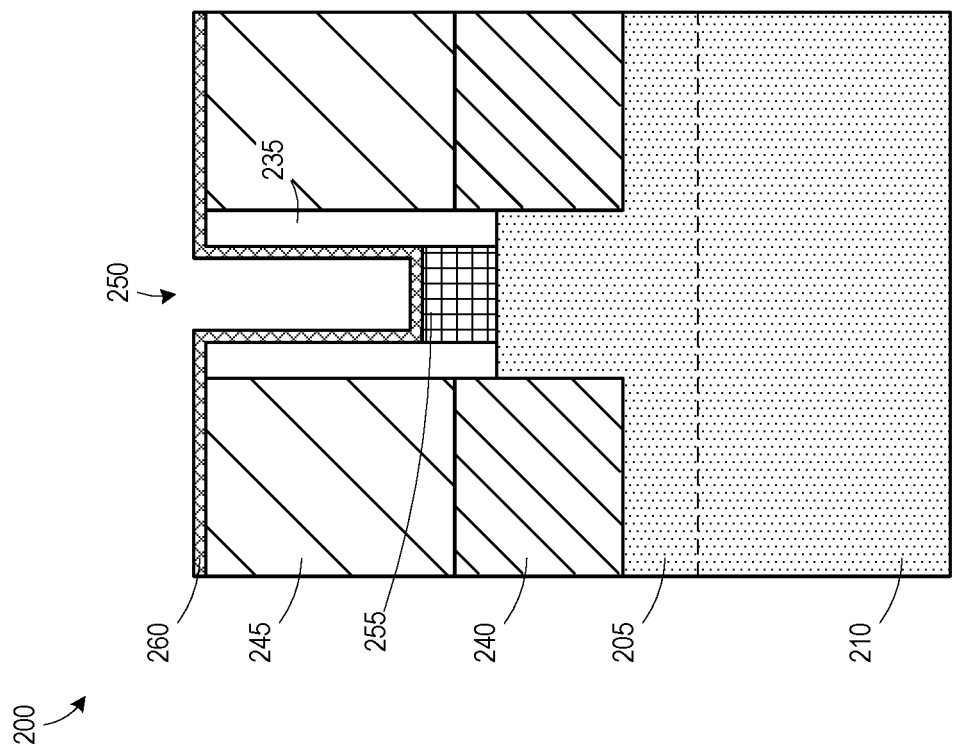
Figure 2C:
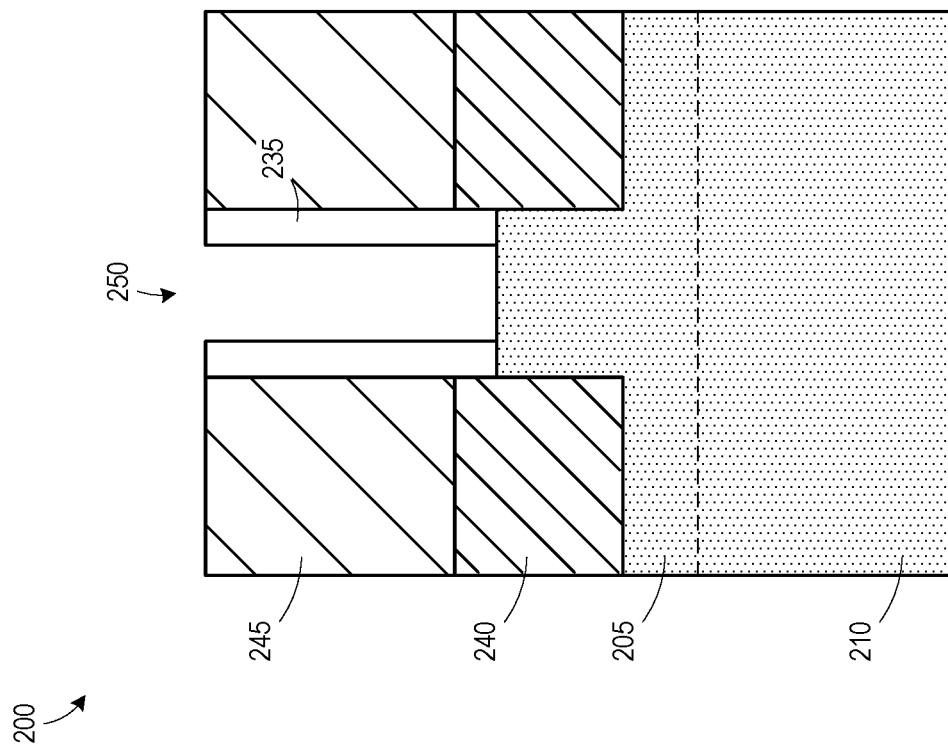

FIG. 2C illustrates the product 200 after a plurality of etch processes were performed to remove the sacrificial placeholder material 225 and any underlying gate dielectric layer (not visible), thereby defining a gate cavity 250.

FIG. 2D illustrates the product 200 after several deposition processes were performed to form a mask layer 255 (e.g., organic patterning layer (OPL)) in the lower portion of the gate cavity 250 and to form a first gate insulation layer 260 (e.g., high-k material, such as hafnium dioxide).

FIG. 2E illustrates the product 200 after an anisotropic etch process was performed to define an inner spacer 260S from the first gate insulation layer 260. An ashing process was performed to strip the mask layer 255.

FIG. 2F illustrates the product 200 after several processes were performed. A deposition process was performed to form a second gate insulation layer 265 in the gate cavity 250. One or more deposition processes were performed to form a gate electrode 270 in the gate cavity. The gate electrode 270 may have multiple layers, such as a barrier layer, one or more work function material layers, and a metal fill layer (e.g., tungsten, aluminum, etc.). A planarization process was performed to remove excess portions of the gate electrode 270 and the second gate insulation layer 265 positioned above the upper surface of the dielectric layer 245. The first and second gate insulation layers 260, 265 may be the same material, so the combination of the inner spacer 260S and the second gate insulation layer 265 may be seen as a gate insulation layer 275 with an increased thickness in an upper portion the gate cavity 250.

Figures 2G, 2H:
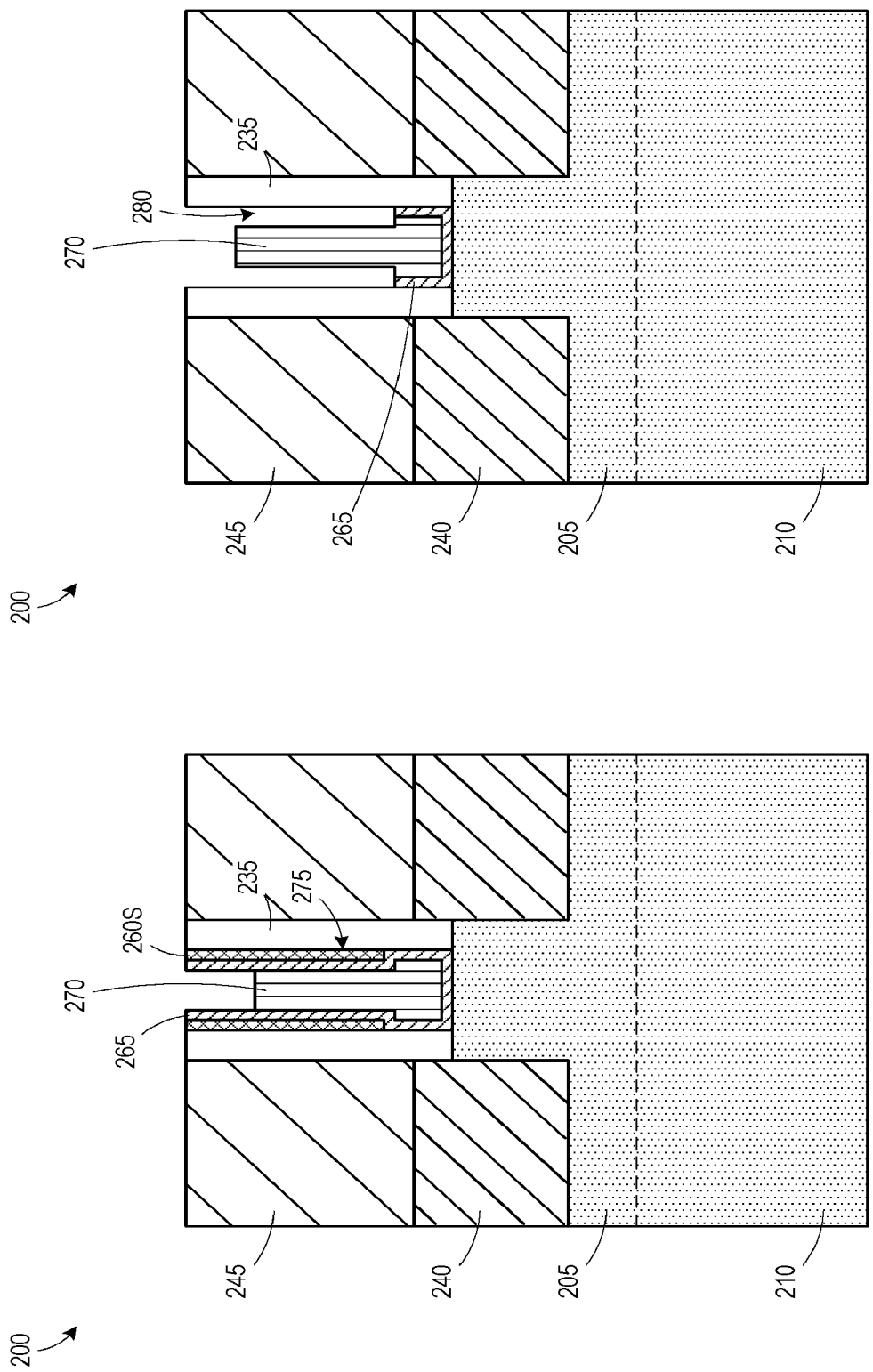

FIG. 2G illustrates the product 200 after an etch process was performed to recess the gate electrode 270.

FIG. 2H illustrates the product 200 after an etch process was performed to recess the inner spacer 260S and the second gate insulation layer 265 to define an air gap cavity 280 adjacent the gate electrode 270. The recessing may extend to the entire depth of the inner spacer 260S (i.e., the portion of the gate insulation layer 275 having the increased thickness).

FIG. 2I illustrates the product 200 after a deposition process was performed to form a gate cap layer 285 in the gate cavity 250 above the gate electrode 270. A planarization process was performed to remove excess portions of the gate cap layer 285 extending above the dielectric layer 245. During the deposition process, the gate cap layer 285 pinches off the upper portion of the air gap cavity 280. The provision of the air gap cavity 280 adjacent the gate electrode 270 reduces the effective capacitance of the product 200, thereby improving performance.

FIGS. 3A-3C illustrate an alternative process flow for forming the product 200'. FIG. 3A illustrates the product 200' starting with the device 200 shown in FIG. 2G after an etch process was performed to recess the sidewall spacer 235, the inner spacer 260S, and the gate insulation layer 265.

FIG. 3B illustrates the product 200' after an etch process was performed to recess the inner spacer 260S and the second gate insulation layer 265 to define the air gap cavity 280 adjacent the gate electrode 270. The recessing may extend to the entire depth of the inner spacer 260S (i.e., the portion of the gate insulation layer 275 having the increased thickness).

FIG. 3C illustrates the product 200' after a deposition process was performed to form the gate cap layer 285 in the gate cavity 250 above the gate electrode 270. A planarization process was performed to remove excess portions of the gate cap layer 285 extending above the dielectric layer 245. During the deposition process, the gate cap layer 285 pinches off the upper portion of the air gap cavity 280.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A device, comprising:
   a gate electrode positioned above a semiconductor material region;
   a sidewall spacer positioned adjacent the gate electrode;
   a gate insulation layer having a first portion positioned between the gate electrode and the semiconductor material region and a second portion positioned between a lower portion of the sidewall spacer and a sidewall of a lower portion of the gate electrode;
   an air gap cavity located between the sidewall spacer and an upper portion of the gate electrode, wherein an upper surface of the second portion of the gate insulation layer and an upper surface of the lower portion of the gate electrode define an outer lateral boundary of the air gap cavity; and
   a gate cap layer positioned above the gate electrode, wherein the gate cap layer seals an upper end of the air gap cavity so as to define an air gap positioned adjacent the gate electrode,
   wherein the lower portion of the gate electrode has a lateral thickness that is greater than a lateral thickness of the upper portion of the gate electrode, and
   wherein the air gap cavity is in contact with the upper portion of the gate electrode.

2. The device of claim 1, wherein the gate cap layer contacts upper sidewall portions of the sidewall spacer.

3. The device of claim 1, further comprising a dielectric layer positioned adjacent the sidewall spacer, wherein the gate cap layer is positioned above an upper surface of the sidewall spacer and contacts the dielectric layer.

4. The device of claim 1, wherein the first portion of the gate insulation layer is oriented substantially horizontally and the second portion of the gate insulation layer is oriented substantially vertically.

5. The device of claim 1, wherein a lower end of the air gap cavity is bounded by an upper surface of the second portion of the gate insulation layer.

6. The device of claim 1, wherein the sidewall spacer comprises an inner surface and wherein the second portion of the gate insulation layer is positioned on and in contact with a lower portion of the inner surface of the sidewall spacer.

7. The device of claim 6, wherein the second portion of the gate insulation layer is positioned on and in contact with a portion of the sidewall of the gate electrode.

8. The device of claim 7, wherein the sidewall spacer comprises a vertical height, wherein the second portion of the gate insulation layer is positioned along a portion of the vertical height of the sidewall spacer.

9. The device of claim 1, wherein the gate insulation layer comprises one of silicon dioxide or a high-k material, the gate electrode comprises at least one metal-containing material and the sidewall spacer comprises silicon nitride.

10. The device of claim 1, wherein the air gap cavity has a lateral thickness that is greater than a lateral thickness of the second portion of the gate insulation layer.

11. A device, comprising:
    a gate electrode positioned above a semiconductor material region;
    a sidewall spacer positioned adjacent the gate electrode;
    a gate insulation layer having a first substantially horizontally oriented portion positioned between the gate electrode and the semiconductor material region and a second substantially vertically oriented portion positioned between a lower portion of the sidewall spacer and a sidewall of a lower portion of the gate electrode;

an air gap cavity located between the sidewall spacer and an upper portion of the gate electrode, wherein an upper surface of the second substantially vertically oriented portion of the gate insulation layer and an upper surface of the lower portion of the gate electrode define an outer lateral boundary of the air gap cavity; and a gate cap layer positioned above the gate electrode, wherein the gate cap layer seals an upper end of the air gap cavity so as to define an air gap positioned adjacent the gate electrode, wherein the lower portion of the gate electrode has a lateral thickness that is greater than a lateral thickness of the upper portion of the gate electrode, and wherein the air gap cavity is in contact with the upper portion of the gate electrode.

12. The device of claim 11, wherein the sidewall spacer comprises an inner surface wherein the gate cap layer contacts the inner surface of the sidewall spacer.

13. The device of claim 11, further comprising a dielectric layer positioned adjacent the sidewall spacer, wherein the gate cap layer is positioned above an upper surface of the sidewall spacer and contacts the dielectric layer.

14. The device of claim 11, wherein the sidewall spacer comprises an inner surface and wherein the second substantially vertically oriented portion of the gate insulation layer is positioned on and in contact with a lower portion of the inner surface of the sidewall spacer.

15. The device of claim 14, wherein the second substantially vertically oriented portion of the gate insulation layer is positioned on and in contact with a portion of the sidewall of the gate electrode.

16. The device of claim 11, wherein the sidewall spacer comprises a vertical height, wherein the second substantially vertically oriented portion of the gate insulation layer is positioned along a portion of the vertical height of the sidewall spacer.

17. A device, comprising:
a gate electrode positioned above a semiconductor material region;

a sidewall spacer positioned adjacent the gate electrode, the sidewall spacer comprising an inner surface and a vertical height;

a gate insulation layer having a first substantially horizontally oriented portion positioned between the gate electrode and the semiconductor material region and a second substantially vertically oriented portion positioned along a portion of the vertical height of the sidewall spacer, wherein the second substantially vertically oriented portion of the gate insulation layer is positioned on and in contact with a lower portion of the inner surface of the sidewall spacer and on and in contact with a sidewall of a lower portion of the gate electrode;

an air gap cavity located between the sidewall spacer and an upper portion of the gate electrode, wherein an upper surface of the second substantially vertically oriented portion of the gate insulation layer and an upper surface of the lower portion of the gate electrode define an outer lateral boundary of the air gap cavity; and a gate cap layer positioned above the gate electrode, wherein the gate cap layer seals an upper end of the air gap cavity so as to define an air gap positioned adjacent the gate electrode, wherein the lower portion of the gate electrode has a lateral thickness that is greater than a lateral thickness of the upper portion of the gate electrode, and wherein the air gap cavity is in contact with the upper portion of the gate electrode.

18. The device of claim 17, wherein the gate cap layer contacts an upper portion of the inner surface of the sidewall spacer.

19. The device of claim 17, further comprising a dielectric layer positioned adjacent the sidewall spacer, wherein the gate cap layer is positioned above an upper surface of the sidewall spacer and contacts the dielectric layer.

20. The device of claim 17, wherein the gate insulation layer comprises one of silicon dioxide or a high-k material, the gate electrode comprises at least one metal-containing material and the sidewall spacer comprises silicon nitride.

* * * * *